(12) United States Patent
Sorg et al.

(10) Patent No.: US 8,159,648 B2
(45) Date of Patent: Apr. 17, 2012

(54) METHOD AND DEVICE FOR THE CORRECTION OF IMAGING DEFECTS

(75) Inventors: Franz Sorg, Aalen (DE); Peter Deufel, Koenigsbronn (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 777 days.

(21) Appl. No.: 12/171,394

(22) Filed: Jul. 11, 2008

(65) Prior Publication Data

US 2008/0316444 A1 Dec. 25, 2008

Related U.S. Application Data

(63) Continuation of application No. PCT/EP2006/012120, filed on Dec. 15, 2006, which is a continuation of application No. 11/341,894, filed on Jan. 30, 2006, now Pat. No. 7,724,351.

(51) Int. Cl.
*G03B 27/68* (2006.01)
*G03B 27/52* (2006.01)
(52) U.S. Cl. .......................................... 355/52; 355/55
(58) Field of Classification Search .................. 355/52, 355/53, 55
See application file for complete search history.

(56) References Cited

U.S. PATENT DOCUMENTS

| | | | | |
|---|---|---|---|---|
| 5,151,186 A | * | 9/1992 | Yoo et al. | 210/541 |
| 5,392,119 A | | 2/1995 | McArthur | |
| 5,610,684 A | * | 3/1997 | Shiraishi | 355/55 |
| 5,677,757 A | | 10/1997 | Taniguchi et al. | |
| 6,307,618 B1 | | 10/2001 | Suzuki et al. | |
| 6,377,333 B1 | | 4/2002 | Chiba et al. | |
| 2002/0012109 A1 | * | 1/2002 | Suzuki et al. | 355/53 |
| 2002/0187406 A1 | * | 12/2002 | Magome et al. | 430/5 |
| 2003/0128349 A1 | | 7/2003 | Unno | |
| 2004/0233401 A1 | * | 11/2004 | Irie | 355/30 |
| 2006/0007418 A1 | * | 1/2006 | Hamatani et al. | 355/52 |
| 2007/0019305 A1 | | 1/2007 | Ulrich et al. | |

FOREIGN PATENT DOCUMENTS

EP 0 874 283 10/1998
WO WO 2005/064404 7/2005

OTHER PUBLICATIONS

U.S. Appl. No. 60/696,118, filed Jul. 1, 2005, Ulrich et al.

* cited by examiner

*Primary Examiner* — Peter B Kim
(74) *Attorney, Agent, or Firm* — Fish & Richardson P.C.

(57) ABSTRACT

The disclosure relates to a microlithography projection exposure system having optical corrective elements configured to modify the imaging characteristics, as well as related systems and components.

8 Claims, 5 Drawing Sheets

METHOD AND DEVICE FOR THE CORRECTION OF IMAGING DEFECTS

CROSS-REFERENCE TO RELATED APPLICATIONS

The present application is a continuation of international application No. PCT/EP2006/012120, filed Dec. 15, 2006, which claims benefit of U.S. Ser. No. 11/341,894, filed Jan. 30, 2006. The contents of international application No. PCT/EP2006/012120 are hereby incorporated by reference.

FIELD

The disclosure relates to a microlithography projection exposure system having optical corrective elements configured to modify the imaging characteristics, as well as related systems and components.

BACKGROUND

FIG. 1 shows such an example of a projection exposure system 1 that includes an illumination apparatus 3 and an apparatus 4 to accommodate and position a mask provided with a grid-like structure, a so-called reticle 5, by which the subsequent structures on a wafer 2 are determined. Projection exposure system 1 also includes an apparatus 6 to hold, move and position the wafer 2, and an imaging apparatus, namely a projection objective 7 having a plurality of optical elements, such as lenses 8 which are mounted in an objective housing 10 of the projection objective 7 via frames 9.

Typically, a basic functional principle in this case provides that the structures inserted into the reticle 5 are imaged reduced in size on the wafer 2. The illumination apparatus 3 provides a projection beam 11 of electromagnetic radiation for imaging the reticle 5 on the wafer 2, for example from the visible band, the UV or EUV band. A laser or the like can be used as a source of this radiation. The radiation is formed in the illumination apparatus 3 by optical elements such that the projection beam 11 has the desired properties with regard to diameter, polarization, shape of the wavefront and the like when it is incident on the reticle 5. The optical elements may be refractive, reflective, or different types of components, or combinations thereof.

Often, after exposure, the wafer 2 is moved on in the direction of the arrow, so that a multiplicity of individual regions, each having the structure prescribed by the reticle 5, are exposed on the same wafer 2. Due to the step-like feeding movement of the wafer 2 in the projection exposure system 1, it is often also referred to as a stepper. Optionally, a scanning image of each area is carried out in many modern machines, and such systems are commonly referred to as scanners.

An image of the reticle 5 is generated via the projection beam 11 and is transferred to the wafer 2 with a correspondingly reduced size by the projection objective 7, as already explained above. The projection objective 7 has a multiplicity of individual refractive, diffractive and/or reflective optical elements such as lenses, mirrors, prisms, end plates and the like.

SUMMARY

In some embodiments, the disclosure provides a device and a method by which flexible correction of imaging defects in a projection exposure system is possible with simultaneously minimal mechanical and thermal loads and minimal contamination of the interior of the system. In certain embodiments, the disclosure provides a device that permits improved correction of imaging defects in projection exposure systems.

In some embodiments, the projection exposure system used in semiconductor lithography has a first and at least one further optical corrective element, with the first optical corrective element being arranged in the region of a pupil plane of the projection exposure system and the further optical corrective element being arranged at a greater distance from the pupil plane than the first corrective element. In some instances, the first corrective element is arranged at a distance from the pupil plane which corresponds to a sub-aperture ratio of greater than 0.75, such as greater than 0.9. The sub-aperture ratio is a measure of the distance of an object to a pupil plane; a sub-aperture ratio of 1 means that an object is located on the pupil plane. The closer the sub-aperture ratio tends to 0, the greater is the distance between the object and the pupil plane. A more detailed description of the definition of the sub-aperture ratio can be found in the U.S. provisional application US 60/696,118, from the same applicant. There, the sub-aperture ratio is described as the ratio of the principal beam height to the marginal beam height VM on the optically active surface of an optical element. The further optical corrective element can be arranged at a distance from the pupil plane which corresponds to a sub-aperture ratio of less than 0.75, such as less than 0.5. This arrangement of the two optical corrective elements can provide the advantage of efficient correction of image defects, such as constant image defects over the entire image plane, in the region of the pupil plane. Because the optical elements arranged in the region of the pupil plane can generate constant image defects over the entire image plane, effective correction of such defects is may be possible by this approach.

In some embodiments, an optical corrective element is a plane-parallel plate. Optionally, one, several, or even all optical corrective elements can be plane-parallel plates. Plane-parallel plates as corrective elements can provide the advantage that they are easy to manufacture and replace in the projection exposure system, and that they can be measured in a simple manner via interferometric methods. Furthermore, their corrective action is comparatively robust against eccentricities—particularly when used in the vicinity of a pupil plane.

In certain embodiments, an optical corrective element can be a screen, such as a vapor-deposited screen of the first order or a variable screen.

In some embodiments, an optical corrective element is an interference filter or an intensity filter, such as a neutral filter. Here, neutral filters have the property that they allow, in a simple manner, compensation for local deviations in the transmission of the objective, such as in the radial direction.

One advantageous use of screens is that the zero-order diffraction of the diffraction image generated by the reticle can be efficiently masked or attenuated by a screen arranged on a pupil plane or in the vicinity of a pupil plane, leading to an improvement in the contrast and hence an improvement to the image on the wafer. However, the diffraction occurring at the reticle depends strongly on the type of structures to be exposed and the illumination settings. This makes it desirable to flexibly match the used shape and position of the screen to the respectively given conditions. By way of example, this can be achieved by providing a replacement device which permits a rapid replacement of the optical corrective element as soon as the optical conditions change, for example when a new reticle is used. Here, the use of a replacement device has the particular advantage that, it is not necessary to completely open the objective housing to replace the optical corrective element, as a result of which the risk of contamination of the interior of the objective housing is reduced. Of course, the use of the replacement device is not limited to the rapid replacement of screens; the further optical corrective elements specified above can advantageously also be rapidly replaced by the replacement device.

The arrangement of the further optical corrective element at a greater distance from the pupil plane than the first optical corrective element means that this corrective element will be closer to a field plane of the projection exposure system than the first optical corrective element. Here, a field plane or an image plane is understood to be a plane in which an image or intermediate image of the object plane is generated. Typically, the optical elements used, for example lenses, are particularly exposed to inhomogeneous loads, which lead to imaging defects. The density of the lens material can locally change or increase in the strongly illuminated areas, so that the imaging properties of the lens change and imaging defects result. Effective correction of such defects can be achieved using the solution according to the disclosure by virtue of the fact that the further optical corrective element is arranged in the region of those optical elements of the projection exposure system which are in the vicinity of the field, since in this manner the defects caused by the effects described above can be rectified in the vicinity of the location of their creation.

One advantageous procedure for replacing the optical corrective element is to firstly record the application parameters of the projection exposure system, and to predict degradation phenomena on the basis of the recording. Subsequently, at least one matched corrective element can be produced in advance, significantly before the planned point in time of a replacement, and then be replaced at a defined point in time. This procedure can be further improved by additional measurement of the application parameters of the projection exposure system, or prediction of the expected degradation appearances on the basis of drift measurements and/or known illumination parameters. This method has the advantage that the times to replace optical corrective elements can be reduced effectively.

BRIEF DESCRIPTION OF THE DRAWINGS

The disclosure is provided in connection with FIGS. 1 to 7, in which.

DETAILED DESCRIPTION

Figure 1:
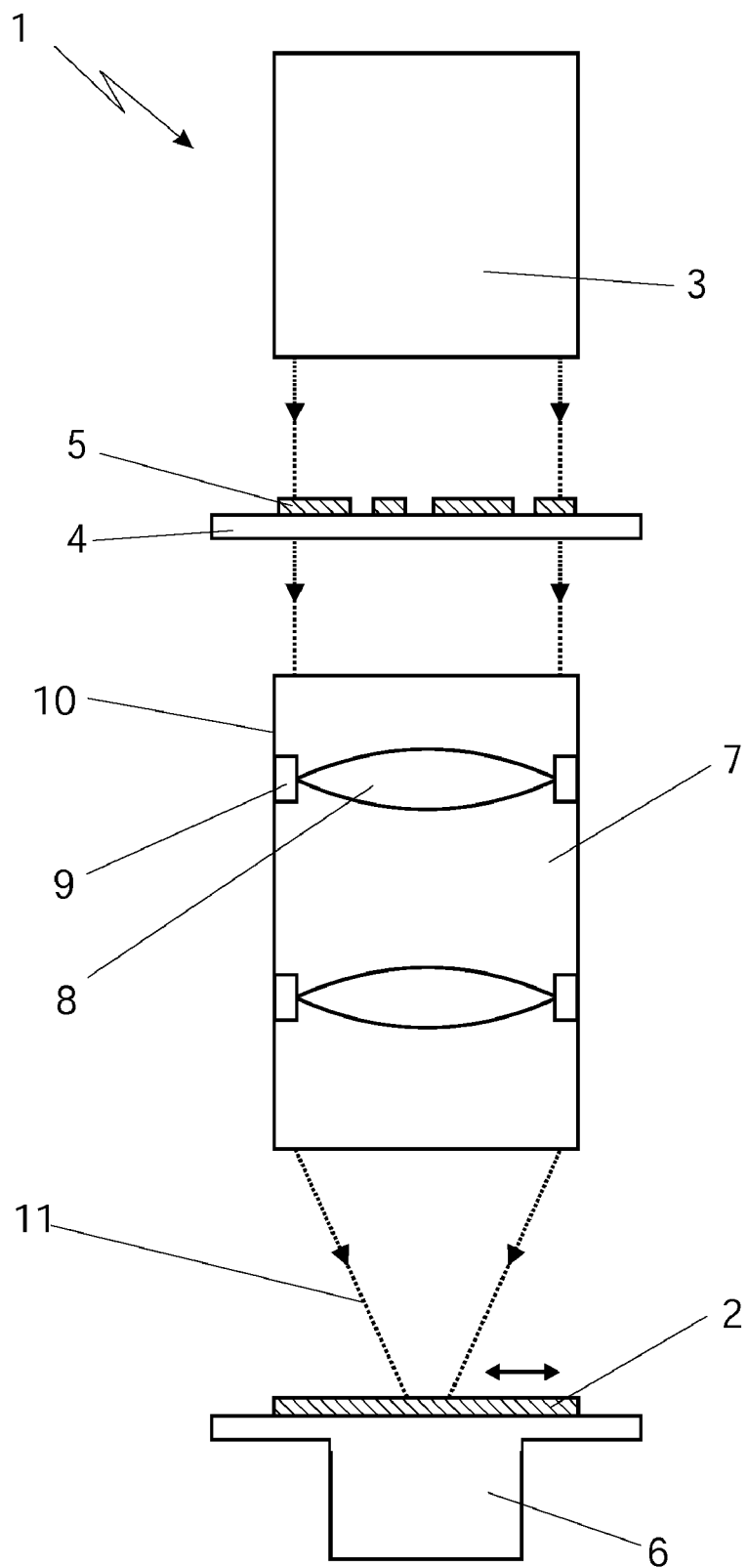
FIG. 1 shows an exemplary microlithography projection exposure apparatus.
Figure 2:
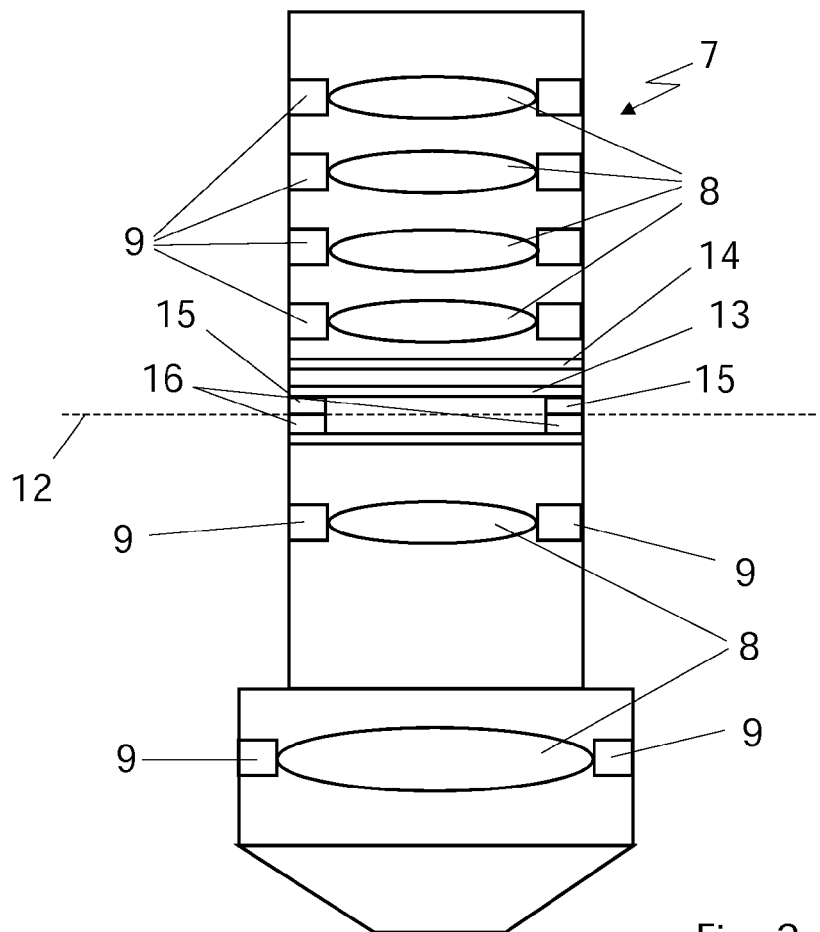
FIG. 2 shows an exemplary arrangement of the two optical corrective elements in the projection objective of a projection exposure system.

FIG. 2 shows an exemplary arrangement of the two optical corrective elements 13, 14 in the projection objective 7 of a projection exposure system. The projection objective 7 has a plurality of lenses 8 mounted in frames 9; furthermore, the location of a pupil plane 12 of the projection objective 7 is indicated by a dashed line. Here, in the region of the pupil plane 12, the first optical corrective element 13 is connected to the holding elements 16 via manipulators 15; a loose arrangement of the optical corrective elements 13 and 14 in the projection exposure system is also conceivable. The manipulators 15 allow variation of the tilting of the optical corrective element 13 or else variation of the distance of the optical corrective element 13 from the pupil plane 12; in this case, they can be in the form of piezo-manipulators. Here, the optical corrective element 13 can be fixed to the manipulators 15 by, for example, spring elements, pneumatic elements, magnetic elements, reduced pressure elements or else interlocking elements. The distance at which the first corrective element 13 is arranged from the pupil plane 12 corresponds to a sub-aperture ratio of >0.75. The second optical corrective element 14 is arranged at a distance from the pupil plane 12 and hence from the first optical corrective element 13; in this case, the distance of the second optical corrective element 14 from the pupil plane 12 corresponds to a sub-aperture ratio of <0.75. By way of example, the optical corrective elements 13 and 14 here can be plane-parallel plates, screens such as a vapor-deposited screen of the first order, or else variable screens. Furthermore, interference filters or else intensity filters, such as neutral filters, can be used as optical corrective elements 13 or 14. In this case, the disclosure is not limited to the optical corrective elements 13 and 14 being adjacent, as illustrated in FIG. 2; in fact, it is also feasible for further optical elements to be arranged in the region between the optical corrective elements 13 and 14.

Figure 3:
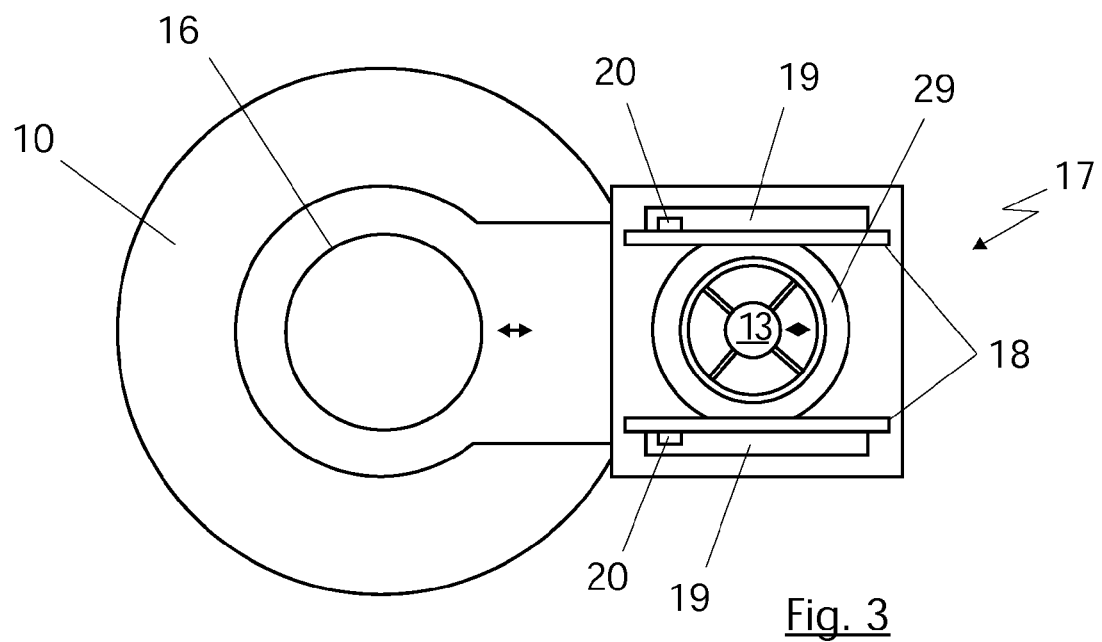
FIG. 3 shows an exemplary replacement device for replacing one of the optical corrective elements.

FIG. 3 shows an exemplary replacement device 17 for replacing one of the optical corrective elements 13 or 14. In the example shown in FIG. 3, the replacement device 17 is in the form of a carriage. In this case, the replacement device 17 in the form of a carriage is an arrangement of fixed guide rails 19 connected to moveable guide rails 18 by adapter frame 29, ensuring linear guidance of the optical corrective element 13 into the beam path of the projection objective 7 (not illustrated in FIG. 3). In this case, the moveable guide rails 18, the adapter frame 29 or else the fixed guide rails 19 can be equipped with sensor units 20 for determining the position of the optical corrective element 13. The drive of the replacement device 17, not illustrated in FIG. 3, should in this case be selected such that the introduction of vibration or else of heat into the projection objective 7 is kept as low as possible; this can be achieved by the use of linear motors, pneumatic elements or else moving coils for a drive.

In the example shown in FIG. 3, the optical corrective element 13 is an intensity filter for the central shadow. Via the replacement device 17, the optical corrective element 13 is inserted in the region of the holding element 16 by a linear motion. Here, the final position of the optical corrective element 13 with respect to the other components of the projection objective 7 is determined during the insertion of the optical corrective element 13 into the adapter frame 29. In this case, the holding element 16 is connected to the objective housing 10 of the projection objective 7 (not illustrated in FIG. 3).

This measure means that the vast majority of the components of the replacement device 17 have no contact with the interior of the objective.

This can result in various advantages, such as:
the components for the positioning of the external optical corrective element 13 can avoid particle created by friction from being deposited on the surfaces of the optical elements arranged in the projection objective 7, and causing scattered light;

in the case of defect, the optical corrective element 13 can be completely replaced with little effort and without replacing the entire projection objective 7;

upgrades/redesigns can be undertaken even in the case of objectives which are already in use without the need to replace the objective; in this case, an optical corrective element 13 which is completely different to the originally used element can also be installed; and/or the service can be sped up with a reduced downtime of the projection exposure system.

Figure 4:
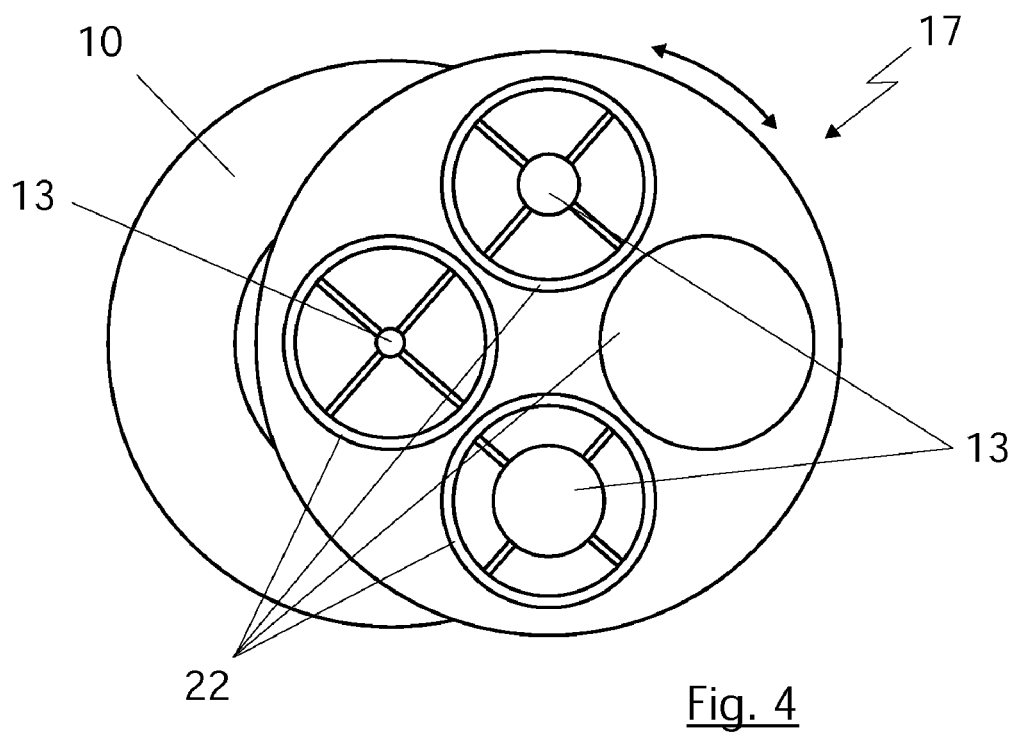
FIG. 4 shows a replacement device is in the form of a rotating disk.

FIG. 4 shows the replacement device 17 is in the form of a rotating disk. In this case, the replacement device 17 in the form of a rotating disk has four accommodation units 22 for accommodating optical corrective elements 13. In the present example, three of the four accommodation units 22 of the replacement device 17 in the form of a rotating disk are provided with optical corrective elements 13, in this case intensity filters; the fourth accommodation unit 22 remains empty, as a result of which exposure without an intensity filter, for example, becomes possible, or it is possible to provide the empty accommodation unit 22 for replacement of the optical corrective element 13. The particular advantage of using a rotating disk as a replacement device 17 that this makes it possible to keep the horizontal forces acting on the objective housing 10, and hence the projection objective 7, to a minimum, since only torques and no linear forces occur as the acceleration torques during rapid braking or acceleration of the replacement device 17. In this case, as illustrated in FIG. 4, the replacement device 17 in the form of a rotating disk can be partly located outside the objective housing 10, making it easier to replace the optical corrective elements 13. This advantage is however offset by the disadvantage that, if part of the replacement device 17 in the form of a rotating disk is arranged outside the objective housing 10, increased complexity is desired to avoid the influx of dirt into the interior of the objective housing 10. This problem can be resolved by arranging the replacement device 17 in the form of a rotating disk completely in the interior of the objective housing 10; of course, this results in certain limitations with regard to the maximum number of optical corrective elements 13 available for rapid replacement. It is furthermore feasible to arrange the drive of the replacement device in the form of a rotating disk not illustrated in FIG. 4 both within and outside of the objective housing 10.

Figure 5:
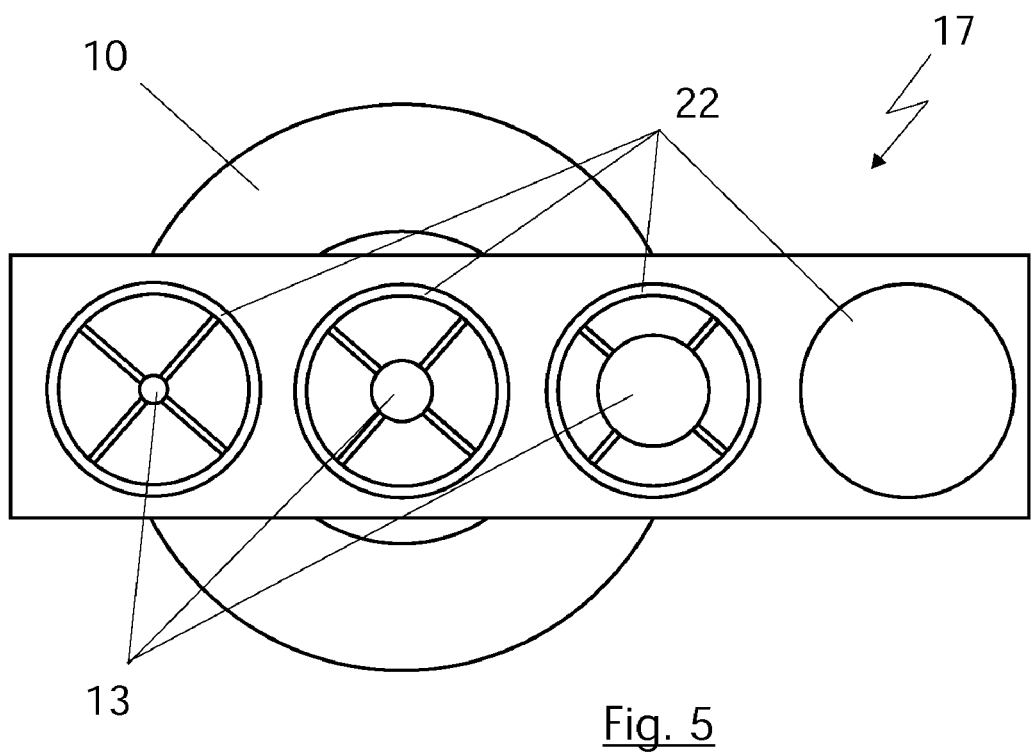
FIG. 5 shows the replacement device as a rotating disk.

The replacement device 17 is FIG. 5 is a rotating disk. FIG. 5 shows a replacement device 17 in the form of a linear carriage. Here, the accommodation units 22 of the replacement device 17 in the form of a linear carriage are arranged linearly along the profile of the carriage. In this case, the replacement device 17 in the form of a linear carriage can run horizontally through the entire objective housing 10. It is common to both solutions illustrated in FIGS. 4 and 5 that the replacement device 17 itself has a plurality of accommodation units 22 and thus has a dual functionality as replacement device 17 on the one hand, and magazine on the other. It is particularly advantageous in the case of this solution that a separate magazine can be dispensed with, as a result of which a significant amount of installation space can be saved.

Figure 5A:
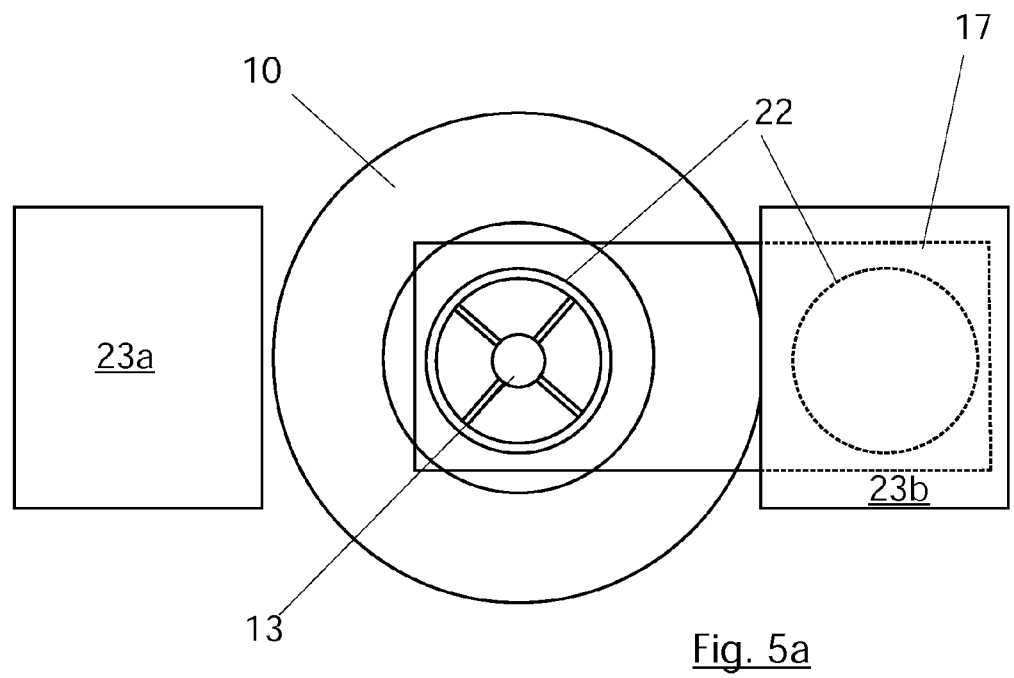
FIG. 5a shows the replacement device in conjunction with two mutually opposite magazines.

FIG. 5a provides a high degree of flexibility and rapid replacement in particular. The replacement device 17 is in the form of a linear carriage with two accommodation units 22 for optical corrective elements 13. In contrast to FIG. 5, two stack magazines 23a and 23b are in this case arranged on opposite sides of the objective housing 10. Here, the replacement device 17 can be moved horizontally in a linear movement from one magazine 23a,b to the other through the entire objective housing 10. Using this, the removal of one optical corrective element from the beam path of the projection exposure system and the insertion of an optical corrective element can be carried out within the same movement of the replacement device, without changing the direction of the movement. As a result, the number of acceleration and deceleration processes for the replacement of an optical corrective element is minimized, this allowing quicker replacement. Optical corrective elements 13 can be removed from or inserted into the replacement device 17 from both the magazine 23a and magazine 23b. During the operation of the projection exposure system with an optical corrective element 13 in one of the magazines 23a or 23b, this arrangement allows the insertion of the fitting optical corrective element 13 for the subsequently provided operational parameters of the system into the accommodation unit 22 of the replacement device 17. This procedure allows a no-longer required corrective element 13 out of the beam path of the system and, during the course of the same movement, insertion of the new corrective element 13 for the parameters of the system into the beam path within a single linear movement, with a practically unlimited number of different corrective elements. This allows changes to the parameters of the system within a time of <30 ms, such as <10 ms. Via the mentioned measure, the level of utilization of the system can be significantly increased and thus the productivity can be improved.

Of course, the idea illustrated by FIG. 5a can also be transferred to the other embodiments.

Figure 6:
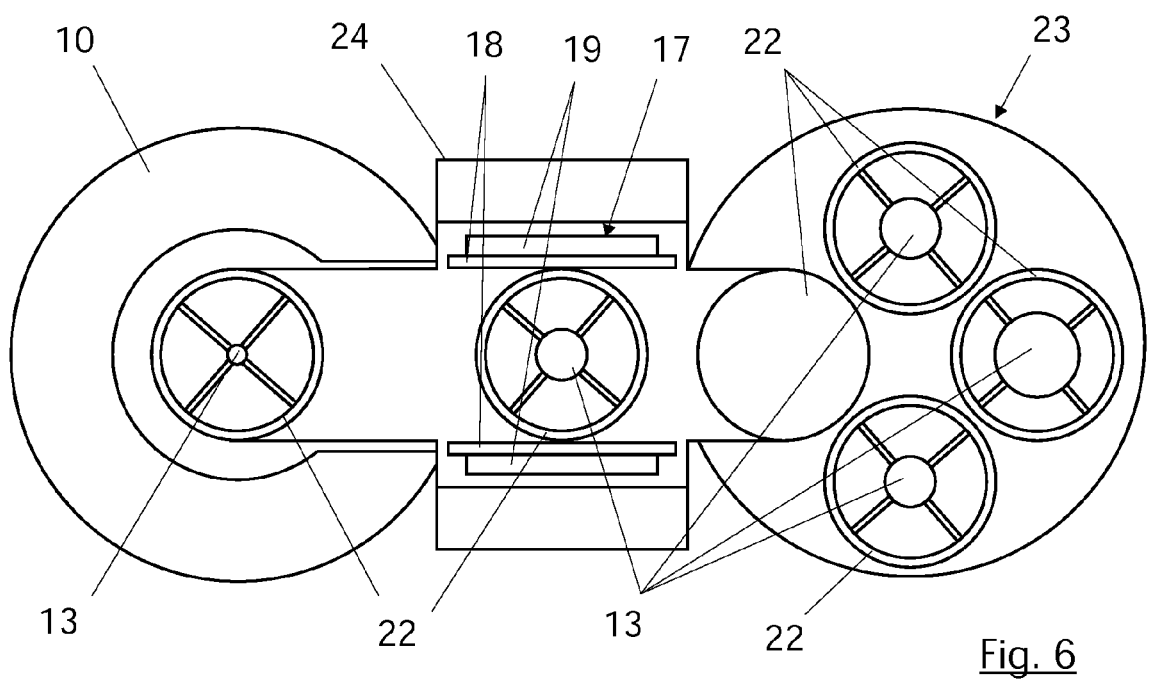
FIG. 6 shows a carriage as a replacement device combined with a magazine in the form of a rotating disk.

FIG. 6 shows a carriage used as the replacement device 17 is combined with a magazine 23 in the form of a rotating disk. In this case, the magazine 23 has four accommodation units 22, three of which are equipped with optical corrective elements 13. The fourth accommodation unit 22 is not occupied in the present example; it is available for accommodating an optical corrective element 13 from the interior of the objective housing 10. The replacement device 17 is, in the form of as a linear carriage which moves in and out of the interior of the objective housing 10 along the guide rails 18 and 19. This can provide the advantage that the opening, through which the optical corrective elements 13 are inserted into the interior of the objective housing 10, can be kept small in comparison with the rotating disk solution described in FIG. 4 and, in this manner, the risk of the introduction of dirt into the interior of the objective housing 10 can be effectively reduced. Moreover, the risk of contamination can be further reduced by providing a part 24, through which the optical corrective elements 13 pass prior to and after replacement and through which, by way of example, a purge gas is continuously passed, as a result of which dirt possibly penetrating from the outside can be discharged before the optical corrective element 13 reaches the interior of the objective housing 10. In this case, it is also feasible for the entire replacement device 17 and the magazine 23 to be arranged together in a space through which purge gas passes, so that, during the process of replacing the optical corrective element 13, there is no contact with the surroundings and, purge gas already flows around the optical corrective elements 13 during their storage in the magazine 23 and the elements are thus protected to the greatest possible extent from contamination.

In this case, the purge gas can advantageously be discharged from the projection objective in the region of the replacement device 17; in other words, the main purge outlet (not illustrated) of the projection objective 7 is located in the region of the replacement device 17. By this measure, contamination of the interior of the projection objective 7 is avoided particularly effectively.

In some embodiments, the magazine 23 can also be a stack magazine with optical corrective elements 13 or 14 stacked vertically one above the other.

It is likewise possible to implement the replacement device 17 in such a manner that a rotating disk provided with a plurality of optical corrective elements 13 is located on a linear carriage and can be inserted completely into the interior of the objective housing 10 or also be removed therefrom. Solutions in which the optical corrective element 13 is replaced by a swinging arm or a double swinging arm are also conceivable.

Of course it is possible to replacement both the optical corrective elements 13 closer to the pupil plane 12 and the optical corrective elements 14 further away from the pupil plane 12 by the above-described exemplary arrangements.

Figure 7:
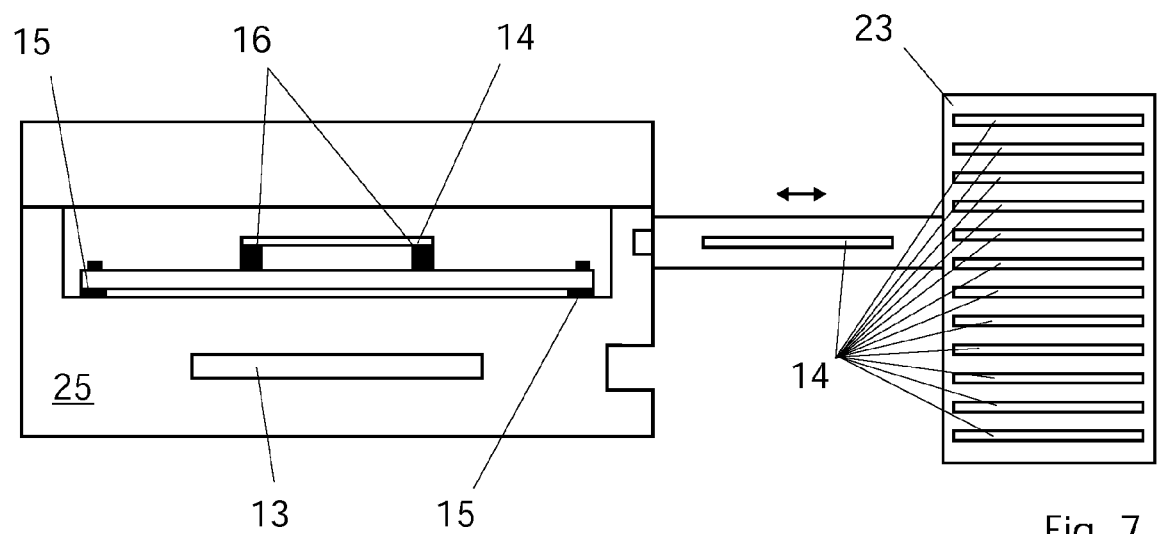
FIG. 7 shows the optical corrective elements are arranged together on a holding frame.

A further advantageous implementation of the present disclosure is illustrated in FIG. 7. The optical corrective elements 13 or 14 are in this case arranged together on a holding frame 25. In this case, for example, the first optical corrective element 13 can be permanently integrated in the holding frame in the vicinity of the pupil plane. The holding frame holds the second optical corrective element 14 by the holding elements 16 and the manipulators 15. In this case, the holding frame 25 can be designed in such a manner that it can easily be replaced as a whole. Furthermore, on account of the described modular design, the second optical corrective element 14 in the holding frame 25 can be replaced without removing it from the objective housing 10. By way of example, in combination with the magazine 23 in the form of a stack magazine, the second optical corrective element 14 can, in this manner, easily be replaced in a known manner (see the previous figures); furthermore this can provide the advantage that the two optical corrective elements 13 and 14 are arranged within one unit and therefore arranged particularly compactly.

Figure 8:
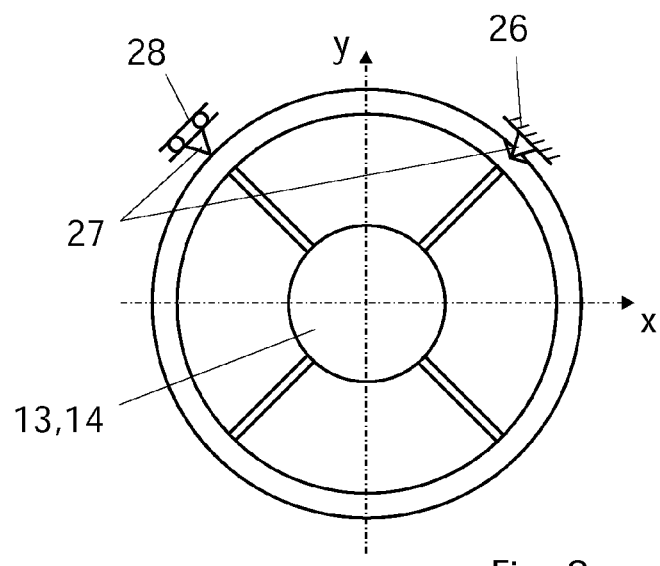
FIG. 8 shows a concept for mounting an optical corrective element.

FIG. 8 shows a bearing concept for mounting an optical corrective element 13 or 14 in the interior of a projection objective 7, the optical corrective element 13 or 14 being in the form of a fixed screen and being mounted only at two bearing points 27 via the supports 26 and 28 in the interior of the projection objective 7, not illustrated in FIG. 8. In this case, the design of the bearing points 27 can be chosen in such a way that a bearing point made from a hard metal, a ruby prism or hardened steel is used. Here, the first support 26 is implemented as a fixed support; a loose support is used in the present example as a second support 28, in which the line contact principle is used.

The described variants and exemplary embodiments of the disclosure should not be considered in isolation; any combinations of the previously illustrated solutions are of course conceivable.

What is claimed is:

1. A system, comprising: an optical corrective element that is a replaceable part, the optical corrective element including an optically active surface positioned in a plane of the system that is different from a pupil plane of the system; and a replacement device configured to replace the optical corrective element, the replacement device being designed such that removal of the optical corrective element from a beam path of the system and the insertion of a replacement optical corrective element into the beam path of the system can be performed in the same movement of the replacement device, wherein:

the system is a microlithography projection exposure system; the replacement device comprises at least two accommodation units configured to accommodate optical corrective elements; and the replacement device is a linear carriage, the linear carriage and the optical corrective elements being able to be inserted from at least two magazines in the accommodation devices of the linear carriage.

2. The projection exposure system as claimed in claim 1, wherein at least one of the optical corrective elements is a plane-parallel plate.

3. The projection exposure system as claimed in claim 1, wherein at least one of the optical corrective elements is a screen.

4. The projection exposure system as claimed in claim 1, wherein at least one of the optical elements is an interference filter or an intensity filter.

5. The projection exposure system as claimed in claim 1, wherein at least one of the two magazines is a stack magazine.

6. The projection exposure system as claimed in claim 1, wherein at least one of the two magazines is a rotating disk magazine.

7. The projection exposure system as claimed in claim 1, wherein an optically active surface of the optical corrective element is arranged a distance from the pupil plane of the system where a ratio of a principal beam height to a marginal beam height is greater than 0.75.

8. The projection exposure system as claimed in claim 1, wherein an optically active surface of the optical corrective element is arranged a distance from the pupil plane of the system where a ratio of a principal beam height to a marginal beam height is less than 0.5.

* * * * *

UNITED STATES PATENT AND TRADEMARK OFFICE
CERTIFICATE OF CORRECTION

PATENT NO.            : 8,159,648 B2                                     Page 1 of 1
APPLICATION NO.       : 12/171394
DATED                 : April 17, 2012
INVENTOR(S)           : Franz Sorg It is certified that error appears in the above-identified patent and that said Letters Patent is hereby corrected as shown below:

Column 6,
Line 39, delete "is," and insert --is--

Signed and Sealed this
Twelfth Day of June, 2012

David J. Kappos
*Director of the United States Patent and Trademark Office*